United States Patent
Cerda, Jr.

(10) Patent No.: US 6,917,654 B1
(45) Date of Patent: Jul. 12, 2005

(54) INCREASED DIGITAL BANDWIDTH CARRIED ON AN ANALOG SIGNAL CYCLE USING A DATA STRUCTURE

(75) Inventor: Salvador Cerda, Jr., Peculiar, MO (US)

(73) Assignee: Sprint Communications Company L.P., Overland Park, KS (US)

(*) Notice: Subject to any disclaimer, the term of this patent is extended or adjusted under 35 U.S.C. 154(b) by 821 days.

(21) Appl. No.: 09/840,428

(22) Filed: Apr. 23, 2001

(51) Int. Cl.[7] ................................................ H04L 27/00
(52) U.S. Cl. .................. 375/259; 370/479; 370/533; 704/212; 341/50; 341/173
(58) Field of Search ........................ 375/268, 259, 375/219, 353; 704/212; 371/5.1, 49.1

(56) References Cited

U.S. PATENT DOCUMENTS

| | | | | |
|---|---|---|---|---|
| 4,346,473 A | * | 8/1982 | Davis .......................... | 714/786 |
| 5,856,980 A | * | 1/1999 | Doyle .......................... | 714/704 |
| 5,940,135 A | | 8/1999 | Petrovic et al. | |
| 6,002,684 A | * | 12/1999 | McVerry ...................... | 370/359 |
| 6,198,779 B1 | * | 3/2001 | Taubenheim et al. ....... | 375/316 |
| 6,445,476 B1 | * | 9/2002 | Kahn et al. .................. | 398/189 |
| 6,535,554 B1 | * | 3/2003 | Webster et al. ............. | 375/233 |
| 6,603,808 B1 | * | 8/2003 | Anne et al. .................. | 375/222 |
| 6,661,837 B1 | * | 12/2003 | Abdelilah et al. .......... | 375/227 |
| 6,662,322 B1 | * | 12/2003 | Abdelilah et al. .......... | 714/708 |
| 2003/0152154 A1 | * | 8/2003 | Johnson ...................... | 375/259 |
| 2003/0206578 A1 | * | 11/2003 | Betts .......................... | 375/219 |

* cited by examiner

*Primary Examiner*—Stephen Chin
*Assistant Examiner*—Harry Vartanian

(57) ABSTRACT

A communication system is disclosed that encodes multiple bits of digital data on a single analog signal cycle. The communication system includes a digital data encoding system that receives the multiple bits of digital data and looks up the digital data in a Digital-to-Analog (D/A) conversion table. The D/A conversion table correlates the multiple bits of digital data to amplitudes of an analog signal and yields amplitudes values. The digital data encoding system then generates the analog signal cycle based on the amplitude values. The digital data encoding system advantageously increases the bandwidth available to customers, which is particularly important to help solve "last mile" bandwidth problems. The communication system also includes a digital data decoding system on the receiver side that decodes the multiple bits of digital data from the analog signal cycle using an Analog-to-Digital (A/D) conversion table.

16 Claims, 6 Drawing Sheets

| BITS | 0000 | 0001 | 0010 | 0011 | 0100 | ... | 1010 | 1011 | 1100 | ... |
|---|---|---|---|---|---|---|---|---|---|---|
| 0000 |  | +8,-2 | +8,-4 |  |  | ... |  |  |  |  |
| 0001 | +1,-1 |  |  |  |  | ... |  |  |  |  |
| 0010 | +1,-2 | +9,-2 | +17,-2 |  |  | ... |  |  |  |  |
| 0011 | +1,-3 |  |  |  |  | ... |  |  |  |  |
| 0100 | +1,-4 | +5,-4 | +9,-4 |  |  | ... |  |  |  |  |
| ... | ... | ... | ... | ... | ... | ... | ... | ... | ... |  |
| 1010 | +5,-2 | +13,-2 | +7,-6 |  |  | ... |  |  |  |  |
| 1011 |  | +4,-3 |  |  |  | ... |  |  |  |  |
| 1100 | +3,-4 | +7,-4 | +11,-4 |  |  | ... |  |  |  |  |
| ... |  |  |  |  |  |  |  |  |  |  |

| AMPLITUDE (V) | -1 | -2 | -3 | -4 | -5 | -6 | -7 | -8 | -9 | ... |
|---|---|---|---|---|---|---|---|---|---|---|
| +1 | 0000 0001 | | | 0000 0100 | | | | | | |
| +2 | | 0000 0010 | 0000 0011 | | | | | | | |
| +3 | | | | 0000 1100 | | | | | | |
| +4 | | | 0001 1011 | | | | | | | |
| +5 | | 0000 1010 | | 0001 0100 | | | | | | |
| +6 | | | | | | 0010 1010 | | | | |
| +7 | | | | 0001 1100 | | | | | | |
| +8 | | 0001 0000 | | 0010 0000 | | | | | | |
| +9 | | 0001 0010 | | 0010 0100 | | | | | | |
| ... | | | | | | | | | | |

328

US 6,917,654 B1

INCREASED DIGITAL BANDWIDTH CARRIED ON AN ANALOG SIGNAL CYCLE USING A DATA STRUCTURE

RELATED APPLICATIONS

Not applicable

FEDERALLY SPONSORED RESEARCH OR DEVELOPMENT

Not applicable

MICROFICHE APPENDIX

Not applicable

BACKGROUND OF THE INVENTION

1. Field of the Invention

The invention is related to the field of communication systems, and in particular, to a communication system that has a higher digital bandwidth on an analog signal cycle by using a data structure.

2. Description of the Prior Art

Many residences and small businesses use Public Switched Telephone Networks (PSTNs) for telecommunications. The PSTNs offer analog services that transmit analog signals between a telephone company central office and a customer. The cabling that connects the customer to the central office can create a bottleneck. The cabling between the customer and the central office is known as the "last mile". Communication providers continue to look for solutions to the bottleneck created by the "last mile".

One solution is to offer digital services that transmit digital signals from the central office to the customer. Examples of digital services are ISDN and Digital Subscribe Line (DSL). Digital signals are transmitted at high frequencies. Unfortunately, the cabling between the central office and customers can be old and lower quality. The old, low-quality cabling can make a high frequency signal susceptible to distortion and can reduce the quality and reliability of the digital signal being transmitted to the customers. Also, the distance between the central office and the customer can affect high frequency signals.

When communication providers cannot offer digital services to customers, analog services might be the best option. The analog signal is generally less susceptible to distortion due to old, low-quality cabling. Those skilled in the art are aware that digital data can be transmitted over an analog signal. To do so in a communication system, the central office converts a digital signal to an analog signal using a conventional digital-to-analog (D/A) converter. The central office then transmits the analog signal to the customer over the "last mile". The customer receives the analog signal and converts the analog signal to a digital signal using a conventional analog-to-digital (A/D) converter. Unfortunately, the current D/A converters are limited in the amount of digital data they can encode on an analog signal. Many D/A converters can only encode up to two digital data bits on a cycle of an analog signal. The bandwidth available to the customer is thus limited by the frequency of the analog signal. In such a situation, the bottleneck created by the "last mile" may not be avoided.

SUMMARY OF THE INVENTION

The invention helps to solve the above problems by encoding at least four bits of digital data onto a single analog signal cycle using a data structure. The invention also helps to solve the above problems by decoding at least four bits of digital data from a single analog signal cycle using a data structure. The invention advantageously increases the amount of digital data bits that can be transmitted over a single analog signal cycle. The invention also Increases the bandwidth available to customers over the "last mile".

In one aspect of the invention, a digital data encoding system is configured to encode digital data bits onto a single analog signal cycle. The digital data encoding system is comprised of a data structure system and a signal generating system. The data structure system comprises a data structure. The data structure system is configured to receive four or more digital data bits. The data structure system is configured to enter the digital data bits into the data structure to yield a symbol. The signal generating system is configured to process the symbol to generate a single analog signal cycle. The digital data encoding system advantageously encodes four or more digital data bits onto the single analog signal cycle.

In a second aspect of the invention, a digital data decoding system is configured to decode digital data bits from a single analog signal cycle. The digital data decoding system is comprised of a signal processing system and a data structure system. The data structure system comprises a data structure. The signal processing system is configured to receive a single analog signal cycle. The signal processing system is configured to process the single analog signal cycle to generate a symbol. The data structure system is configured to enter the symbol into the data structure to yield four or more digital data bits. The digital data decoding system advantageously decodes four or more digital data bits from the single analog signal cycle.

BRIEF DESCRIPTION OF THE DRAWINGS

FIG. 4 depicts a digital-to-analog conversion table in an example of the invention.

FIG. 5 depicts an analog-to-digital conversion table in an example of the invention.

DETAILED DESCRIPTION OF THE INVENTION

Figure 1:
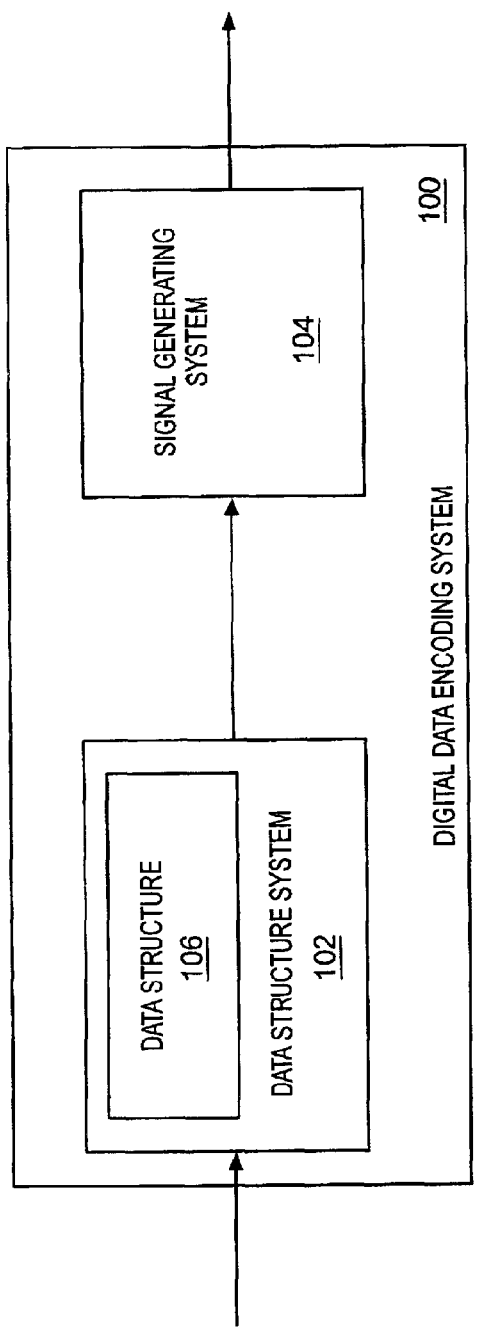
FIG. 1 is a block diagram that illustrates a digital data encoding system in an example of the invention.

Digital Data Encoding—FIG. 1

FIG. 1 is a block diagram that illustrates a digital data encoding system 100 in an example of the invention. The digital data encoding system 100 is comprised of a data structure system 102 and a signal generating system 104. Data structure system 102 comprises a data structure 106. Data structure system 102 communicates with signal generating system 104.

In operation, data structure system 102 receives four or more digital data bits. Data structure system 102 enters the digital data bits into data structure 106 to yield a symbol. A data structure is any system configured to yield a second value based on a first value. A symbol is any value or representation that conveys meaning. One example of a symbol is one or more amplitude values of an analog signal. Data structure system 102 transfers the symbol to signal generating system 104.

Figure 7:
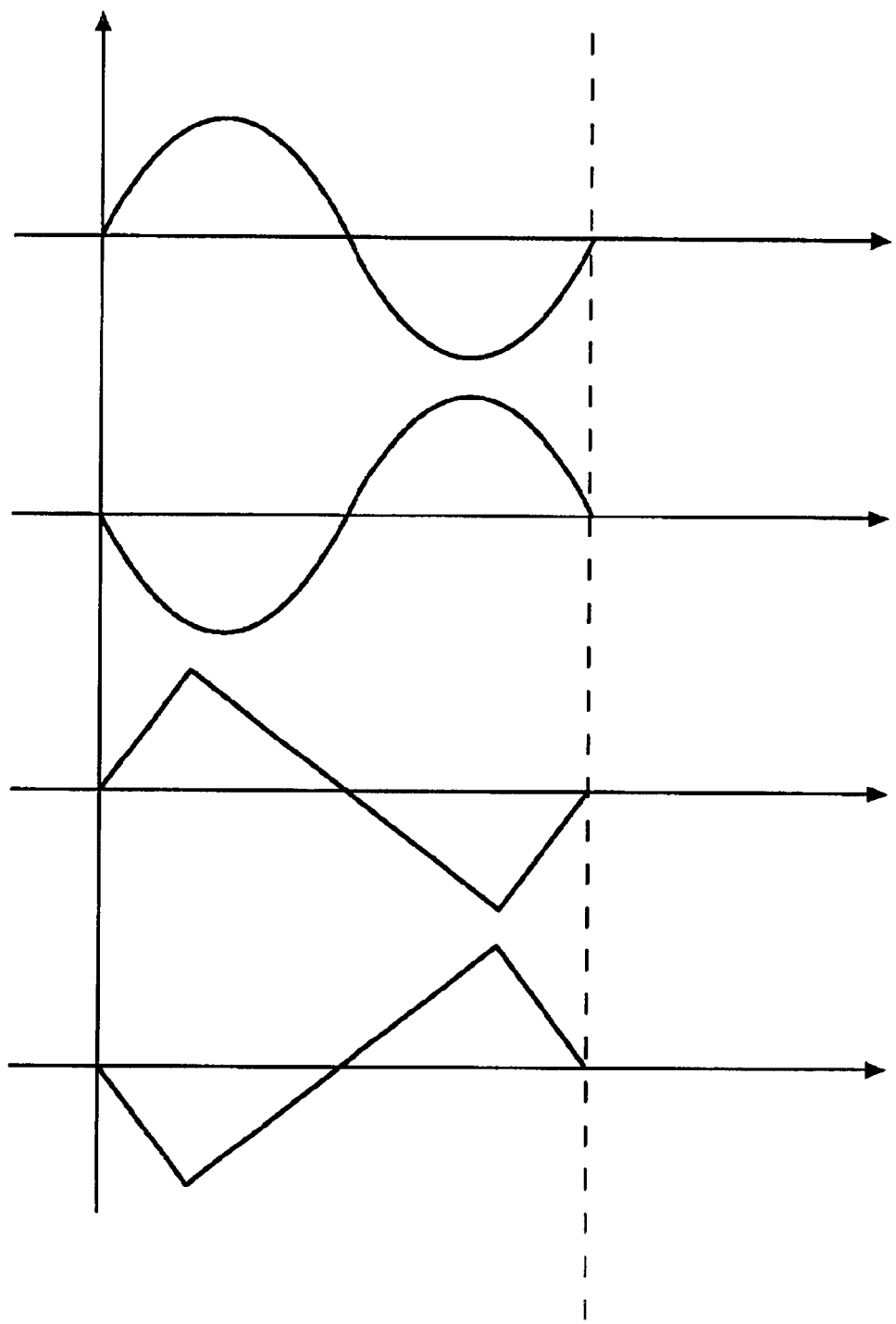
FIG. 7 is a graph that depicts examples of single analog signal cycles in an example of the invention.

Signal generating system 104 receives the symbol. Signal generating system 104 processes the symbol to generate a single analog signal cycle. Examples of single analog signal cycles are depicted in FIG. 7. Signal generating system 104 transmits the single analog signal cycle. Digital data encoding system 100 advantageously encodes four or more digital data bits onto a single analog signal cycle using data structure 106.

Figure 2:
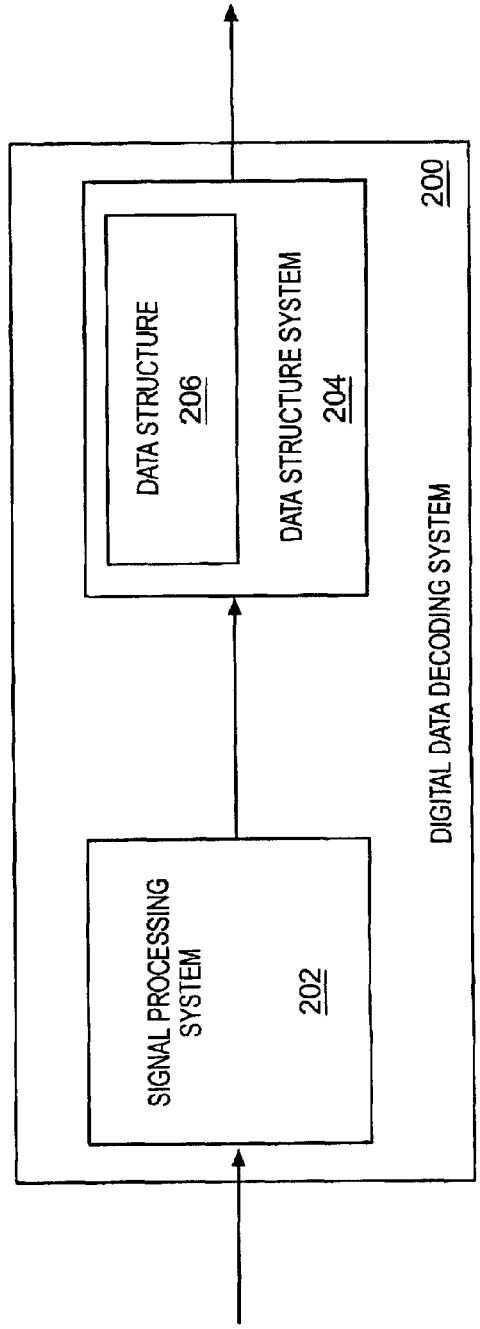
FIG. 2 is a block diagram that illustrates a digital data decoding system in an example of the invention.

Digital Data Decoding—FIG. 2

FIG. 2 is a block diagram that illustrates a digital data decoding system 200 in an example of the invention. The digital data decoding system 200 is comprised of a signal processing system 202 and a data structure system 204. Data structure system 204 comprises a data structure 206. Signal processing system 202 communicates with data structure system 204.

In operation, signal processing system 202 receives a single analog signal cycle. Examples of single analog signal cydes are depicted in FIG. 7. Signal processing system 202 processes the single analog signal cycle to generate a symbol. A symbol Is any value or representation that conveys meaning. One example of a symbol is one or more amplitude values of an analog signal. Signal processing system 202 transfers the symbol to the data structure system 204.

Data structure system 204 receives the symbol. Data structure system 204 enters the symbol into data structure 206 to yield four or more digital data bits. A data structure is any system configured to yield a second value based on a first value. Digital data decoding system 200 advantageously decodes four or more digital data bits from a single analog signal cycle using data structure 206.

A Communication System—FIGS. 3–6

FIGS. 3–6 depict a specific example of a communication system that encodes and decodes digital data onto an analog signal in accord with the present invention. Those skilled in the art will appreciate numerous variations from this example that do not depart from the scope of the invention. Those skilled in the art will also appreciate that various features described below could be combined with other embodiments to form multiple variations of the invention. Those skilled in the art will appreciate that some conventional aspects of FIGS. 3–6 have been simplified or omitted for clarity.

Figure 3:
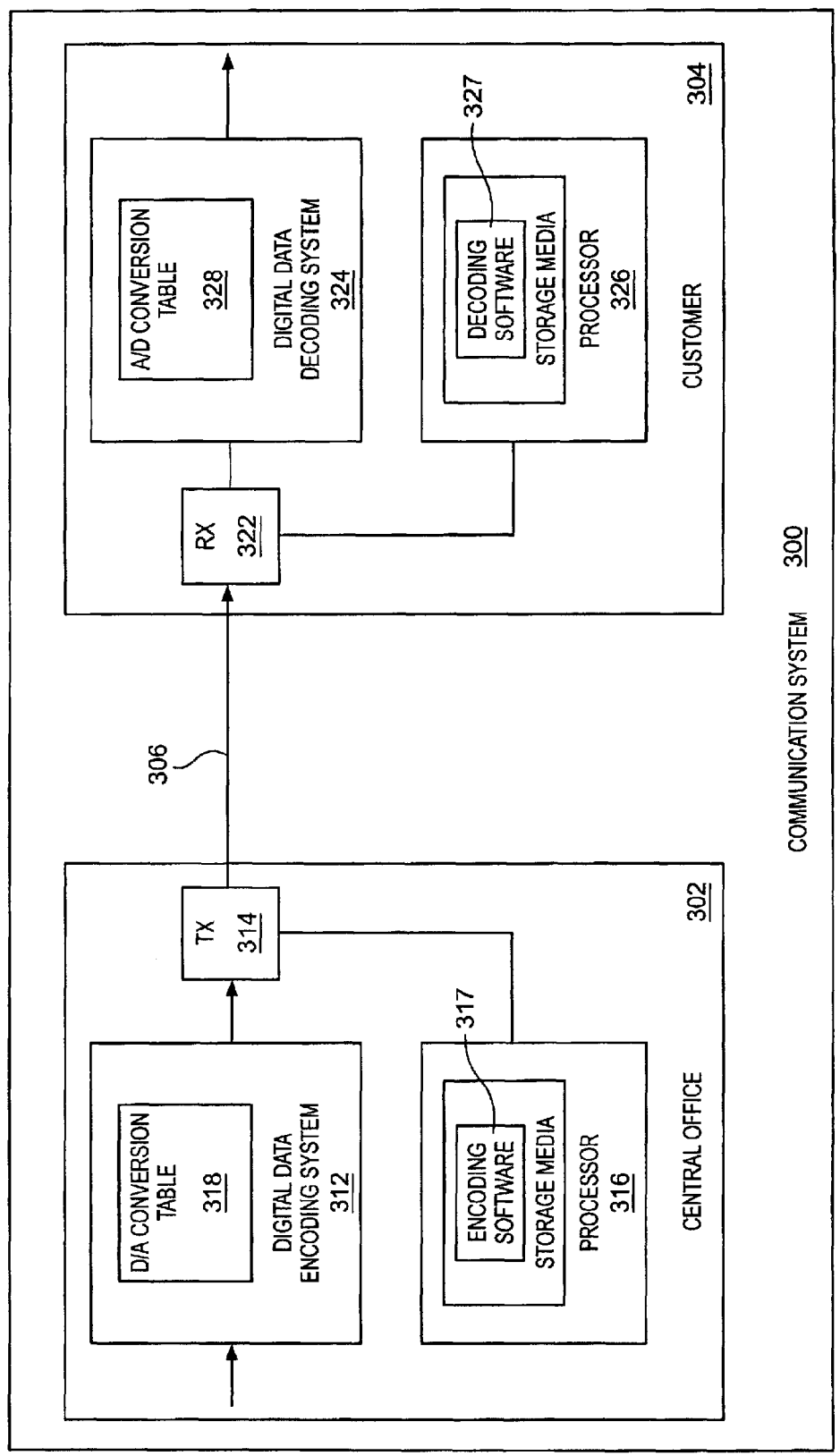
FIG. 3 is a block diagram that illustrates a communication system that implements digital data encoding and decoding systems in an example of the invention.

FIG. 3 is a block diagram that illustrates a communication system 300 in an example of the invention. Communication system 300 comprises a central office 302 and a customer 304. Communication system 300 could be comprised of any transmitter-receiver combination. Central office 302 is connected to customer 304 by a link 306. Link 306 is a standard twisted-pair copper wire. FIG. 3 represents the "last mile" that is well known to those skilled in the art. Central office 302 is comprised of a digital data encoding system 312, a transmitter 314, and a processor 316. Digital data encoding system 312 includes a Digital-to-Analog (D/A) conversion table 318. Customer 304 is comprised of a receiver 322, a digital data decoding system 324, and a processor 326. Digital data decoding system 324 includes an Analog-to-Digital (A/D) conversion table 328.

Transmitter 314 is connected to digital data encoding system 312, processor 316, and receiver 322. Receiver 322 is connected to digital data decoding system 324 and processor 326. Digital data encoding system 312 is comprised of Field Programmable Gate Arrays (FPGA). Digital data encoding system 312 stores D/A conversion table 318 on one or more EPROMs. Digital data decoding system 324 is comprised of FPGAs. Digital data decoding system 324 stores A/D conversion table 328 on one or more EPROMs.

In operation, digital data encoding system 312 receives digital data. In this example, the digital data is 8-bits long. Digital data encoding system 312 enters the digital data into D/A conversion table 318. Table 318 is a look up table. Digital data values in table 318 correspond to amplitude values of an analog signal. An example of table 318 is discussed below in FIG. 4.

Table 318 yields two values that represent amplitudes for a single encoded analog signal cycle. Digital data encoding system 312 generates the encoded analog signal cycle based on the two amplitude values and transfers the encoded analog signal cycle to transmitter 314. Transmitter 314 transmits an analog signal, including the encoded analog signal cycle, to customer 304 over link 306.

The number of bits that can be encoded onto the encoded analog signal cycle depends on the number of steps (N) that the output voltage of transmitter 314 can be divided into. The number of bits also depends on the number of steps (M) that receiver 322 can resolve. For example, if N and M are 256, then the range of integers represented is 0 through 65,535. Thus, the number of digital data bits per analog signal cycle is 16-bits.

Receiver 322 receives the analog signal from transmitter 314 over link 306, and transfers the analog signal to digital data decoding system 324. Digital data decoding system 324 detects a relative zero-axis crossing and captures the single encoded analog signal cycle. Digital data decoding system 324 detects a maximum peak amplitude and a minimum peak amplitude from the encoded analog signal cycle. Digital data decoding system 324 enters a maximum peak amplitude value and a minimum peak amplitude value into A/D conversion table 328. Table 328 is a look up table. Amplitude values in table 328 correspond to digital data. An example of table 328 is discussed below in FIG. 5. Table 328 yields the digital data based on the amplitude values that were entered.

To overcome signal loss and noise distortion over link 306, central office 302 and customer 304 establish the limits of the analog signal amplitudes through handshaking. Transmitter 314 transmits a series of maximum amplitudes to receiver 322. Receiver 322 receives the maximum amplitudes and digital data decoding system 324 adjusts A/D conversion table 328 accordingly. When A/D conversion table 328 is adjusted, a transmitter (not shown) on the receiver 322 side transmits an acknowledgment to a receiver (not shown) on the transmitter 314 side. For example, assume that transmitter 314 transmits with a maximum amplitude of 25 volts. Due to signal loss over the "last mile", receiver 322 may only receive a maximum amplitude of 20 volts. In such a case, digital data decoding system 324 adjusts table 328 to compensate for the 5 volt difference in maximum amplitudes transmitted and the maximum amplitudes received.

The capacity of link 306 is not only defined by the number of digital bits that can be encoded per analog signal cycle, but is also defined by the speed at which digital data encoding system 312 can encode the digital data, and the frequency of the analog signal. Central office 302 can advantageously use digital data encoding system 312 and digital data decoding system 324 for light wave, radio wave, magnetic field, and SONAR technologies. Those skilled in the art will appreciate that the invention can be applied to multiple frequencies using multiplexing to further increase the bandwidth of link 306.

Those skilled in the art will appreciate that digital data encoding system 312 and digital data decoding system 324 could be processors that execute instructions to perform the operations described above. In FIG. 3, digital data encoding system 312 could be processor 316 that executes encoding software 317. Digital data decoding system 324 could be processor 326 that executes decoding software 327. The encoding software 317 and the decoding software 327 are each comprised of instructions that are stored on storage media. The instructions can be retrieved and executed by processor 316 and 326, respectively. In this example, software includes program code and firmware. Some examples of storage media are memory devices, tape, disks, and integrated circuits. The instructions are configured when executed by a processor to direct the processor to operate in accord with the invention. The term "processor" refers to a single processing device or a group of inter-operational processing devices. Some examples of processor 316 and 326 are computers, integrated circuits, and logic circuitry. Those skilled in the art are familiar with instructions, processors, and storage media.

FIG. 4 depicts D/A conversion table 318 in an example of the invention. Table 318 is partially filled in with example values and empty squares in table 318 can be filled to suit a particular implementation of the invention. Table 318 converts 8-bit words into amplitude values for an analog signal cycle. The first column of table 318 comprises the first four bits of the 8-bit word. The first row of table 318 comprises the second four bits of the 8-bit word. The remainder of table 318 comprises amplitude values that correspond to the different 8-bit words represented in the first row and the first column.

Some 8-bit words mathematically correspond to the amplitude values in table 318. For instance, the word "00001100" (12) is represented in table 318 by amplitude values "+3,–4". Multiplying the absolute value of "+3,–4" results in "12". However, the word "00001100" can also be represented by "+4,–3", "+6,–2", and "+2,–6". Only "+3,–4" represents the word "00001100" in table 318 and the other combinations for the word "00001100" are reserved for prime number words that could not otherwise be represented. For instance, the combination of "+4,–3" represents word "00011011" (27). The word "00011011" could not otherwise be represented in table 318 if 25 volts is the maximum amplitude generated by transmitter 314.

FIG. 5 depicts A/D conversion table 328 in an example of the invention. Table 328 is partially filled in with example values and empty squares in table 328 can be filled to suit a particular implementation of the invention. Table 328 converts amplitude values of an analog signal cycle into 8-bit words. The first column of table 328 comprises a first amplitude value. The first row of table 328 comprises a second amplitude value. The remainder of table 328 comprises 8-bit words that correspond to the amplitude values represented in the first row and the first column.

Table 318 can be configured to encrypt the data that is to be transmitted over link 306. For instance, the amplitude values in table 318 could be scrambled according to an encryption algorithm to encrypt the data that is to be transmitted over link 306. Similarly, table 328 can be configured to decrypt the data that is received over link 306. For instance, the digital data bits in table 328 could be scrambled according to a decryption algorithm to decrypt the amplitude values that are received over link 306.

Figure 6:
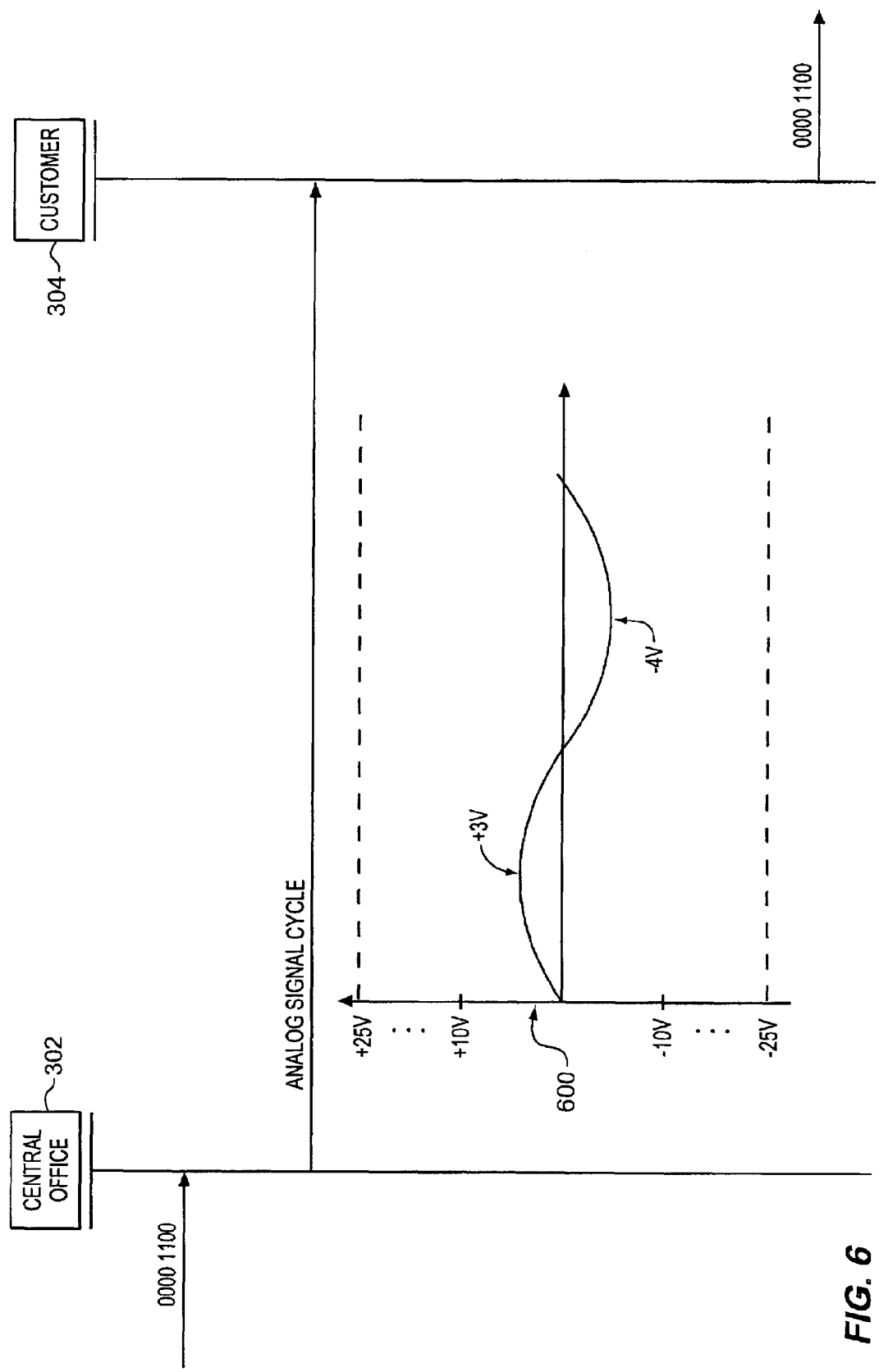
FIG. 6 is a data chart that depicts digital data being encoded and decoded in the communication system in FIG. 3 in an example of the invention.

FIG. 6 is a data chart that depicts digital data being encoded and decoded in communication system 300 in an example of the invention. In this example, central office 302 receives an 8-bit word "00001100". Digital data encoding system 312 enters the 8-bit word into table 318. Table 318 yields amplitude values "+3,–4". Digital data encoding system 312 generates an analog signal cycle based on the amplitude values. The analog signal cycle is depicted in graph 600. The analog signal cycle has a maximum amplitude of +3 volts and a minimum amplitude of –4 volts. Transmitter 314 transmits the analog signal cycle over link 306 to customer 304. Customer 304 receives the analog signal cycle. Digital data decoding system 324 captures the maximum and minimum amplitude values (+3,–4) and enters the amplitude values into table 328. Table 328 yields the 8-bit word "00001100".

Through handshaking, if customer 304 determines that signal loss is occurring over link 306, then customer 304 adjusts values in the first column and the first row of table 328 accordingly. For instance, assume that transmitter 314 transmits with a maximum amplitude of +25 volts. If receiver 322 only receives a maximum amplitude of +20 volts, then customer 304 adjusts the values in the first column and the first row of table 328 by 20%.

The invention is not limited to telecommunications, but includes any art that involves encoding digital data onto an analog signal or decoding digital data from an analog signal using a data structure. The invention could be used in systems that store data on a storage media, such as a magnetic disk or a Compact Disk (CD). The following is an example of how the invention could be used with a storage media device. A data structure system in the storage media device receives digital data bits from a host system, such as a computer. The data structure system enters the digital data bits into an encoding data structure to yield amplitude values of an analog signal. The encoding data structure system transfers the amplitude values to a write channel system. The write channel system then writes the amplitude values onto the storage media. By using the encoding data structure, the storage media device increases the capacity on the storage media.

To read from the storage media, a read channel system in the storage media device reads the amplitude values from the storage media. The read channel system transfers the amplitude values to the data structure system. The data structure system enters the amplitude values into a decoding data structure to yield digital data bits. The storage media device then transmits the digital data bits to the host system.

Those skilled in the art will appreciate variations of the above-described embodiments that fall within the scope of the invention. As a result, the invention is not limited to the specific examples and illustrations discussed above, but only by the following claims and their equivalents.

I claim:

1. A method of operating a communication system, the method comprising:
receiving at least four first digital data bits in a transmitter system;
entering the at least four first digital data bits into a fist data structure to yield a first amplitude value and a second amplitude value;
generating an encoded analog signal cycle based on the first amplitude value and the second amplitude value;
transmitting the encoded analog signal cycle from the transmitter system over a link to a receiver system;
receiving the encoded analog signal cycle over the link in the receiver system;

processing the encoded analog signal cycle to detect a maximum peak amplitude and a minimum peak amplitude from the encoded analog signal cycle; and entering the maximum peak amplitude and the minimum peak amplitude into a second data structure to yield at least four second digital data bits.

2. The method of claim 1 wherein the transmitter system comprises a central office and the receiver system comprises a customer premises.

3. The method of claim 2 wherein the link between the transmitter system and the receiver system comprises a twisted-pair copper wire.

4. The method of claim 1 further comprising:

transmitting maximum amplitudes from the transmitter system to the receiver system;

receiving the maximum amplitudes in the receiver system; and adjusting the second data structure based on the maximum amplitudes.

5. The method of claim 1 wherein:

the first data structure correlates the at least four first digital data bits with the first amplitude value and the second amplitude value; and the second data correlates the at least four second digital data bits with the maximum peak amplitude and the minimum peak amplitude.

6. A communication system, comprising:

a transmitter system configured to receive at least four first digital data bits, enter the at least four first digital data bits into a first data structure to yield a first amplitude value and a second amplitude value, generate an encoded analog signal cycle based on the first amplitude value and the second amplitude value, and transmit the encoded analog signal cycle over a link; and a receiver system coupled to the transmitter system by the link and configured to receive the encoded analog signal cycle over the link, process the encoded analog signal cycle to detect a maximum peak amplitude and a minimum peak amplitude from the encoded analog signal cycle, and enter the maximum peak amplitude and the minimum peak amplitude into a second data structure to yield at least four second digital data bits.

7. The communication system of claim 6 wherein the transmitter system comprise a central office and the receiver system comprises a customer premises.

8. The communication system of claim 6 wherein the link between the transmitter system and the receiver system comprises a twisted-pair copper wire.

9. The communication system of claim 6 wherein:

the transmitter system is configured to transmit maximum amplitudes to the receiver system; and the receiver system is configured to receive the maximum amplitudes and adjust the second data structure based on the maximum amplitudes.

10. The first data structure system of claim 6 wherein:

the first data structure correlates the at least four first digital data bits with the first amplitude value and the second amplitude value; and the second data structure correlates the at least four second digital data bits with the maximum peak amplitude and the minimum peak amplitude.

11. The communication system of claim 6 wherein the transmitter system comprises a digital data encoding system configured to generate the encoded analog signal cycle based on the first amplitude value and the second amplitude value; and a transmitter configured to transmit the encoded analog signal cycle over the link to the receiver system.

12. The communication system of claim 11 wherein the digital data encoding system comprises field programmable gate arrays (FPGA).

13. The communication system of claim 11 wherein the digital data encoding system includes the first data structure stored on an erasable programmable read only memory (EPROM).

14. The communication system of claim 6 wherein the receiver system comprises:

a receiver configured to receive the encoded analog signal cycle over the link; and a digital data decoding system configured to process the encoded analog signal cycle to detect the maximum peak amplitude and the minimum peak amplitude from the encoded analog signal cycle, and enter the maximum peak amplitude and the minimum peak amplitude into the second data structure to yield at least four second digital data bits.

15. The communication system of claim 14 wherein the digital data decoding system comprises field programmable gate arrays (FPGA).

16. The communication system of claim 14 wherein the digital data decoding system includes the second data structure stored on an erasable programmable read only memory (EPROM).

* * * * *